July 20, 1971 TOMEJI OHNO ET AL 3,594,321

PIEZOELECTRIC CERAMIC

Filed Nov. 3, 1969 4 Sheets-Sheet 1

INVENTORS
TOMEJI OHNO
MASAO TAKAHASHI
TSUNEO AKASHI by Sandoe, Hopgood & Calimafde
ATTORNEYS July 20, 1971 TOMEJI OHNO ET AL 3,594,321

PIEZOELECTRIC CERAMIC

Filed Nov. 3, 1969 4 Sheets-Sheet 2

$[\{Pb(Mn_{1/3}Nb_{2/3})O_3\}_u\{Pb(Ni_{1/3}Nb_{2/3})O_3\}_{1-u}]_{0.10}[PbTiO_3]_{0.45}[PbZrO_3]_{0.45}$

INVENTORS
TOMEJI OHNO
MASAO TAKAHASHI
TSUNEO AKASHI
by Sandoe, Hopgood & Calimafde
ATTORNEYS

INVENTORS
TOMEJI OHNO
MASAO TAKAHASHI
TSUNEO AKASHI

BY Sandoe, Hopgood & Calimafde
ATTORNEYS $\left[\{Pb(Mn_{1/3}Nb_{2/3})O_3\}_u\{Pb(Ni_{1/3}Nb_{2/3})O_3\}_{1-u}\right]_{0.40}\left[PbTiO_3\right]_{0.40}\left[PbZrO_3\right]_{0.20}$ INVENTORS
TOMEJI OHNO
MASAO TAKAHASHI
TSUNEO AKASHI
by
Sandoe, Hopgood & Calimafde
ATTORNEYS United States Patent Office 3,594,321
Patented July 20, 1971

3,594,321
PIEZOELECTRIC CERAMIC

Tomeji Ohno, Masao Takahashi, and Tsuneo Akashi, Tokyo, Japan, assignors to Nippon Electric Company, Limited, Minato-ku, Tokyo, Japan
Filed Nov. 3, 1969, Ser. No. 873,233
Claims priority, application Japan, Nov. 5, 1968, 43/81,194
Int. Cl. C04b *35/46, 35/48*
U.S. Cl. 252—62.9 1 Claim

ABSTRACT OF THE DISCLOSURE

Piezoelectric ceramics are provided in solid solution of the quaternary system $$Pb(Mn_{1/3}Nb_{2/3})O_3—Pb(Ni_{1/3}Nb_{2/3})O_3—PbTiO_3—PbZrO_3$$

the ceramic compositions being expressed by the general empirical formula $$[\{Pb(Mn_{1/3}Nb_{2/3})O_3\}_u\{Pb(Ni_{1/3}Nb_{2/3})O_3\}_{1-u}]_x[PbTiO_3]_y[PbZrO_3]_z$$

wherein the subscripts $u$, $x$, $y$ and $z$ denote respectively mol fractions of the respective members and have the following values $$0.00<u<1.00$$

$$x+y+z=1$$

This invention relates to piezoelectric ceramic materials effectively in solid solution of a quarternary system $$Pb(Mn_{1/3}Nb_{2/3})O_3—Pb(Ni_{1/3}Nb_{2/3})O_3—PbTiO_3—PbZrO_3$$

and the object is to provide novel ceramic compositions which exhibit highly desirable piezoelectric properties.

The electromechanical coupling coefficient and the mechanical quality factor have been known to be the most basic of all characteristics in evaluating the piezoelectric properties of piezoelectric materials. The former is a measure of the magnitude of conversion efficiency as conversion of energy takes place from electrical to mechanical or vice versa, i.e., the larger the values of the electromechanical coupling coefficients, the better the conversion efficiencies. The mechanical quality factor is a measure of the degree of energy expended within the material in such conversion, the smaller being the amount of energy expended, the larger the values of the mechanical Q.

BACKGROUND OF THE INVENTION

Ceramic filter elements are among typical applications of piezoelectric materials. In this particular application, the electromechanical coupling coefficients need to be maintained at optionally designated values in ranges extending from extremely small to large values, whereas the mechanical Q values need to be as large as possible.

Transducer elements for mechanical filters are also among important applications of piezoelectric ceramics. It is desirable in this particular application that both the electromechanical coupling coefficient and the mechanical Q have as large values as possible.

Sonar transducers are also one of the main applications of piezoelectric ceramics. In this particular application, it is desirable that values of the electromechanical coupling coefficient be exceptionally large.

There are some other basic constants, such as dielectric constant, dielectric loss, etc. besides the above-mentioned properties, which are to be referenced in evaluating practicability of piezoelectric materials. In industrial applications, the qualification of some particular constants of these materials being controlled to desired values is sometimes greatly desired. As has been fully recognized, improvement of some particular constants of a material relative to other constants can contribute greatly to the industrial utility of the maerial. For example, materials so modified that their dielectric constants are particularly improved (reduced) over other constants have been demanded and developed for applications requiring small (large) electrical impedances.

A detailed description of these facts is abbreviated herein for simplicity, for they are fully dealt with in the following publications:

Design Data for Band-Pass Ladder Filters Employing Ceramic Resonators by R.C.V. Macario, Electronic Engineering, vol. 33, No. 3 (1961) pp. 171–177;

Transducer Properties of Lead Titanate Zirconate Ceramics by D. Berlincourt et al., IRE Transactions on Ultrasonic Engineering, February (1960), pp. 1–6;

Piezoelectric Materials by H. Taffe et al., Proceedings of the I.E.E.E., vol. 53, No. 10 (1965), pp. 1372–1386; and U.S. Pat. No. 3,144,411.

Secondary ingredients have sometimes been included in ceramic compositions of the conventional barium titanate ($BaTiO_3$) or lead titanate-lead zirconate $$(PbTiO_3—PbZrO_3)$$

system in order to improve the piezoelectric and electric properties. However, additions of such secondary ingredients have not been wholly successful. In recent years, attempts for obtaining marked improvements in these characteristics have been made by synthesizing ternary solid solutions consisting of three principal ingredients.

For instance, it has been experimentally verified that solid solutions of the ternary system $Pb(Mg_{1/3}Nb_{2/3})O_3—PbTiO_3—PbZrO_3$ consisting of the principal ingredients in varying proportions have the capability of extensively controlling the piezoelectric and electric constants.

However, merely varying the proportions of the principal ingredients has not been sufficient, that is, unless at elast one of the secondary ingredients selected from the group consisting of manganese (Mn), cobalt (Co), nickel (Ni), iron (Fe), chromium (Cr) in oxidic form is present in the compositions of the ternary system in order to control the electromechanical coupling coefficient, the mechanical Q, etc. (A summary of the foregoing is disclosed, for example, in U.S. Pat. No. 3,268,453).

On the other hand, the controllability of various constants of ceramic materials in solid solution simply by varying the proportions of the principal ingredients of the ternary system $Pb(Ni_{1/3}Nb_{2/3})O_3—PbTiO_3—PbZrO_3$ is disclosed, for instance, in "Izvestiya Akademi Nauk SSSR Seriya Fizicheskaya vol. XXIX, No. 11 (1965)," pp. 2042–2045.

However, the range in which pizeoelectric constants can be controlled by suitably varying the proportions of the principal ingredients of the ceramic compositions of the system $Pb(Ni_{1/3}Nb_{2/3}—PbTiO_3—PbZrO_3$ is appreciably restricted and, moreover, the values of the mechanical Q of these ceramic compositions are quite small.

The objects of the invention will be apparent from the following disclosure and the accompanying drawings, wherein:

contemplated by this invention in terms of the mol ratio of $$Pb(Mn_{1/3}Nb_{2/3})O_3+Pb(Ni_{1/3}Nb_{2/3})O_3:PbTiO_3:PbZrO_3$$

and

FIGS. 5 through 8 illustrate respectively the manner in which the values of electromechanical coupling coeffcient (*kr*), mechanical quality factor (Q*m*) and dielectric loss (tan δ) of ceramic compositions contemplated by this invention vary as $Pb(Mn_{1/3}Nb_{2/3})O_3$ and $Pb(Ni_{1/3}Nb_{2/3})O_3$ are combined in varying proportions with the mol ratio of $$[Pb(Mn_{1/3}Nb_{2/3})O_3+Pb(Ni_{1/3}Nb_{2/3})O_3]:PbTiO_3: PbZrO_3$$

fixed.

DETAIL DESCRIPTION OF THE INVENTION

Figures 1, 2, 3:
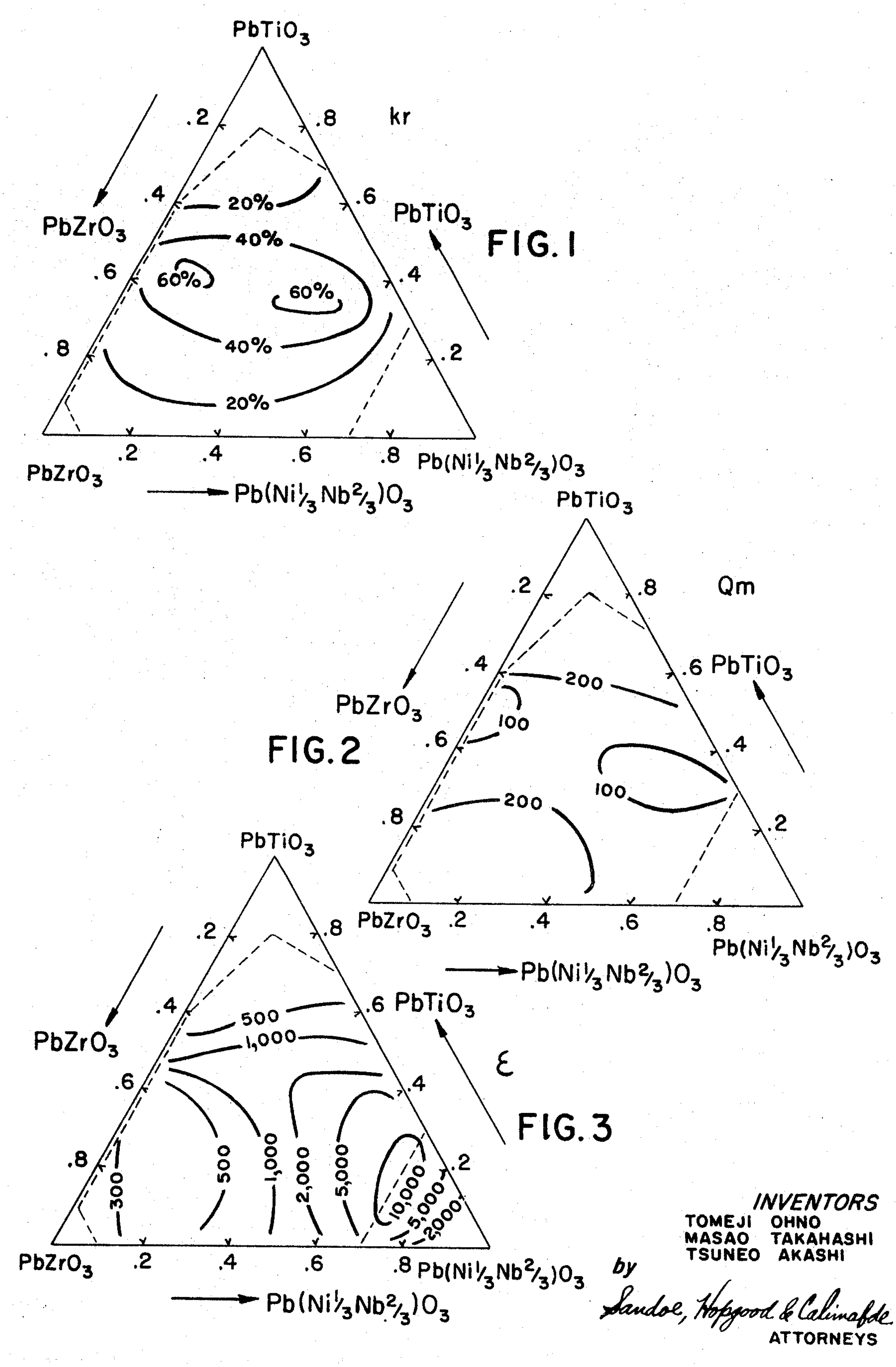
FIGS. 1, 2 and 3 show triangular diagrams of a known system $Pb(Ni_{1/3}Nb_{2/3})O_3—PbTiO_3—PbZrO_3$ in solid solution illustrating the dependence of electromechanical coupling coefficient ($kr$), mechanical quality factor ($Qm$), and dielectric constant ($\epsilon$) on mol fractions of the three principal ingredients, respectively.

FIGS. 1 through 3 illustrate in combination those characteristics of solid solution ceramic compositions of the known system $Pb(Ni_{1/3}Nb_{2/3})O_3—PbTiO_3—PbZrO_3$, the figures showing respectively, changes in values of the electromechanical coupling coefficient (*kr*) obtained by causing discs to vibrate in the radial mode, the mechanical quality factor (Q*m*) obtained under the same condition, and the dielectric constant (ε).

An inspection of these graphs will readily reveal that solid solution compositions exhibiting piezoelectric properties having practical application fall within the areas bounded by the dotted lines. On the other hand, while values of the electromechanical coupling coefficient and the dielectric constant can be controlled over a wide range by suitably selecting the proportions of the principal ingredients, values of the mechanical Q become inevitably small. In other words, applications for these ceramic compositions are considerably restricted.

THE INVENTION

The present invention provides novel ceramic compositions in solid solution of a quaternary system $$Pb(Mn_{1/3}Nb_{2/3})O_3—Pb(Ni_{1/3}Nb_{2/3})O_3—PbTiO_3—PbZrO_3$$

thereby overcoming the drawbacks inherent with solid solution compositions of the ternary system $$Pb(Ni_{1/3}Nb_{2/3})O_3—PbTiO_3—PbZrO_3$$

thereby improving markedly values of the mechanical Q, and greatly extending the controllable range of both the electromechanical coupling coefficient and the dielectric constant.

The ceramic compositions of the invention having improved piezoelectric properties lie within an area bounded by the following coordinates in the triangular compositional diagram:

| x | y | z |
|---|---|---|
| 0.70 | 0.00 | 0.30 |
| 0.70 | 0.30 | 0.00 |
| 0.30 | 0.70 | 0.00 |
| 0.10 | 0.80 | 0.10 |
| 0.01 | 0.60 | 0.39 |
| 0.01 | 0.09 | 0.90 |
| 0.10 | 0.00 | 0.90 |

the compositions being expressed by the general emperical formula $$[\{Pb(Mn_{1/3}Nb_{2/3})O_3\}_u\{Pb(N_{1/3}Nb_{2/3})O_3\}_{1-u}]_x[PbTiO_3]_y[PbZrO_3]_z$$

wherein the subscripts denote mol fractions of the respective members and have the following numerical relations:

$$0.00<u<1.00$$

$$x+y+z=1.00$$

All compositions lying within this area will provide piezoelectric ceramics whose constants, such as electromechanical coupling, mechanical Q, dielectric constant and loss, can be controlled in a wide range and, at the same time, provide greatly improved mechanical Q values.

As will be evident from the empirical formula, the ceramic compositions, according to this invention, contain lead as a divalent metallic element, zirconium and titanium, each as a tetravalent metal, and a combination of manganese and niobium and a combination of nickel and niobium, each in proportions equivalent to a tetravalent metallic element.

The following example will demonstrate that these ceramic compositions exhibit excellent piezoelectric properties.

EXAMPLE

In preparing samples of ceramics of this invention, lead oxide (PbO), manganese carbonate ($MnCO_3$), niobium oxide ($Nb_2O_5$), nickel oxide (NiO), titanium oxide ($TiO_2$), and zirconium oxide ($ZrO_2$), each in powder form, were used as starting materials unless otherwise specified. These materials, which are 98 percent or more purity, were individually weighed to obtain the required amounts, except that $MnCO_3$ was weighed to obtain the equivalent amounts as converted to MnO.

The raw materials were mixed in a ball-mill together with distilled water and the mixture was dried and presintered at 900° C. for one hour. After pulverizing the presintered body, a small amount of distilled water was added and pressed into discs, 20 mm. in diameter, at the pressure of 700 kg./cm.², followed by firing in an atmosphere containing lead oxide vapor for one hour at temperatures ranging between 1200° C. and 1300° C. for compositions having values of *x* less than 0.30 and at temperatures ranging between 1100° C. and 1200° C. for those having values of *x* exceeding 0.30.

The opposite surfaces of each ceramic disc were lapped to a thickness of 1 mm. and a pair of silver electrodes were affixed thereon by brazing.

Poling was then carried out under the following conditions: A DC voltage of 50 kv./cm. was applied across the electrodes for one hour at 100° C. for samples having values of *x* less than 0.10; a DC voltage of 30 kv./cm. was applied for one hour at 100° C. for samples having values of *x* less than 0.20; a DC voltage of 40 kv./cm. was applied for 1 hour at room temperature for *x* less than 0.40; a DC voltage of 30 kv./cm. was applied for one hour at room temperature for *x* exceeding 0.40.

After being piezoelectrically activated, the sintered ceramic bodies were left standing for 24 hours and the electromechanical coupling coefficient (*kr*), the mechanical quality factor (Q*m*), both in the radical mode, the dielectric constant (ε), and the dielectric loss (tan δ) were measured to evaluate the piezoelectric properties. The well-established IRE method was used for the measurement of *kr* and Q*m*. In computing values of *k*, the known method of computation from resonance and anti-resonance frequencies was adopted.

A typical example of samples obtained by the abovementioned preparation method is listed in Table 1 together with the values of *u*, *x*, *y* and *z* of these samples when the ceramic compositions of the invention are expressed by the general empirical formula $$[\{Pb(Mn_{1/3}Nb_{2/3})O_3\}_u\{Pb(Ni_{1/3}Nb_{2/3})O_3\}_{1-u}]_x[PbTiO_3]_y[PbZrO_3]_z$$

wherein $x+y+z=1.00$.

Figure 4:
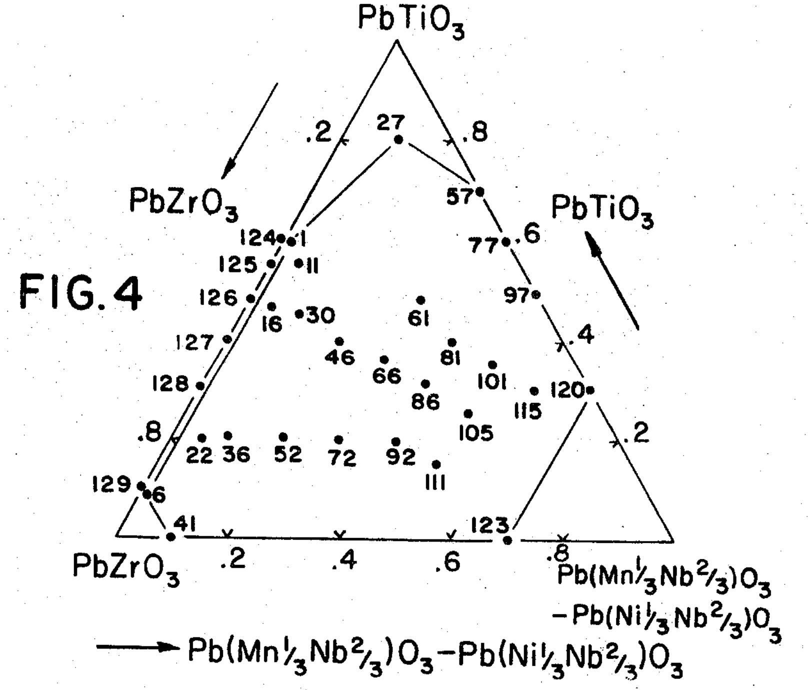
FIG. 4 is a triangular diagram illustrating the compositions of piezoelectric ceramic solid solutions of the novel system $$Pb(Mn_{1/3}Nb_{2/3})O_3—Pb(Ni_{1/3}Nb_{2/3})O_3—PbTiO_3—PbZrO_3$$

A comparison of Table 1 and FIG. 4 will indicate the following: some of the typical samples in Table 1 which are ranked first in all sections of the list are illustrated as dots in FIG. 4 together with the corresponding sample number.

TABLE I

| No. | $u$ | $x$ | $y$ | $z$ | $kr$, percent | Q$m$ | $\epsilon$ | tan, $\delta$, percent |
|---|---|---|---|---|---|---|---|---|
| 1 | 0.00 | 0.01 | 0.60 | 0.39 | 25 | 200 | 350 | 2.6 |
| 2 | 0.40 | 0.01 | 0.60 | 0.39 | 21 | 350 | 330 | 2.1 |
| 3 | 0.80 | 0.01 | 0.60 | 0.39 | 16 | 630 | 300 | 1.9 |
| 4 | 0.90 | 0.01 | 0.60 | 0.39 | 11 | 820 | 290 | 1.2 |
| 5 | 1.00 | 0.01 | 0.60 | 0.39 | 8 | 210 | 270 | 1.8 |
| 6 | 0.00 | 0.01 | 0.09 | 0.90 | 10 | 330 | 340 | 4.4 |
| 7 | 0.40 | 0.01 | 0.09 | 0.90 | 15 | 460 | 240 | 3.1 |
| 8 | 0.80 | 0.01 | 0.09 | 0.90 | 9 | 480 | 300 | 4.3 |
| 9 | 0.09 | 0.01 | 0.09 | 0.90 | 8 | 440 | 320 | 3.7 |
| 10 | 1.00 | 0.01 | 0.09 | 0.90 | 6 | 480 | 320 | 2.4 |
| 11 | 0.00 | 0.05 | 0.55 | 0.40 | 22 | 40 | 510 | 2.1 |
| 12 | 0.40 | 0.05 | 0.55 | 0.40 | 26 | 1,420 | 490 | 1.1 |
| 13 | 0.60 | 0.05 | 0.55 | 0.40 | 31 | 1,850 | 540 | 1.0 |
| 14 | 0.80 | 0.05 | 0.55 | 0.40 | 32 | 2,180 | 490 | 1.1 |
| 15 | 1.00 | 0.05 | 0.55 | 0.40 | 33 | 3,700 | 520 | 1.0 |
| 16 | 0.00 | 0.05 | 0.46 | 0.49 | 54 | 70 | 890 | 4.9 |
| 17 | 0.20 | 0.05 | 0.46 | 0.49 | 57 | 170 | 1,330 | 2.3 |
| 18 | 0.40 | 0.05 | 0.46 | 0.49 | 59 | 960 | 1,230 | 0.8 |
| 19 | 0.60 | 0.05 | 0.46 | 0.49 | 65 | 1,460 | 1,050 | 0.8 |
| 20 | 0.80 | 0.05 | 0.46 | 0.49 | 38 | 2,490 | 940 | 0.9 |
| 21 | 1.00 | 0.05 | 0.40 | 0.49 | 61 | 2,030 | 630 | 1.1 |
| 22 | 0.00 | 0.05 | 0.20 | 0.75 | 20 | 240 | 300 | 2.8 |
| 23 | 0.40 | 0.05 | 0.20 | 0.75 | 16 | 1,150 | 340 | 1.5 |
| 24 | 0.60 | 0.05 | 0.20 | 0.75 | 17 | 2,670 | 280 | 0.8 |
| 25 | 0.80 | 0.05 | 0.20 | 0.75 | 19 | 5,280 | 230 | 0.7 |
| 26 | 1.00 | 0.05 | 0.20 | 0.75 | 17 | 4,470 | 200 | 1.1 |
| 27 | 0.00 | 0.10 | 0.80 | 0.10 | ------ | ------ | ------ | ------ |
| 28 | 0.40 | 0.10 | 0.80 | 0.10 | 19 | 1,890 | 220 | 1.5 |
| 29 | 1.00 | 0.10 | 0.80 | 0.10 | 6 | 910 | 210 | 2.3 |
| 30 | 0.00 | 0.10 | 0.45 | 0.45 | 61 | 170 | 1,600 | 1.9 |
| 31 | 0.20 | 0.10 | 0.45 | 0.45 | 60 | 700 | 1,250 | 1.3 |
| 32 | 0.40 | 0.10 | 0.45 | 0.45 | 63 | 2,100 | 1,100 | 0.8 |
| 33 | 0.60 | 0.10 | 0.45 | 0.45 | 63 | 2,440 | 950 | 1.0 |
| 34 | 0.80 | 0.10 | 0.45 | 0.45 | 62 | 2,030 | 890 | 1.1 |
| 35 | 1.00 | 0.10 | 0.45 | 0.45 | 59 | 1,900 | 1,000 | 1.2 |
| 36 | 0.00 | 0.10 | 0.20 | 0.70 | 23 | 360 | 350 | 2.8 |
| 37 | 0.40 | 0.10 | 0.20 | 0.70 | 21 | 2,670 | 270 | 0.8 |
| 38 | 0.60 | 0.10 | 0.20 | 0.70 | 18 | 4,040 | 310 | 1.2 |
| 39 | 0.80 | 0.10 | 0.20 | 0.70 | 21 | 5,770 | 250 | 0.9 |
| 40 | 1.00 | 0.10 | 0.20 | 0.70 | 21 | 2,760 | 250 | 1.3 |
| 41 | 0.00 | 0.10 | 0.00 | 0.90 | 6 | 40 | 290 | 9.4 |
| 42 | 0.40 | 0.10 | 0.00 | 0.90 | 9 | 3,180 | 270 | 1.0 |
| 43 | 0.60 | 0.10 | 0.00 | 0.90 | 6 | 3,900 | 200 | 1.2 |
| 44 | 0.80 | 0.10 | 0.00 | 0.90 | 7 | 1,340 | 200 | 1.2 |
| 45 | 1.00 | 0.10 | 0.00 | 0.90 | 4 | 400 | 250 | 1.1 |
| 46 | 0.00 | 0.20 | 0.40 | 0.40 | 59 | 120 | 940 | 3.0 |
| 47 | 0.20 | 0.20 | 0.40 | 0.40 | 54 | 1,560 | 660 | 1.8 |
| 48 | 0.40 | 0.20 | 0.40 | 0.40 | 51 | 2,470 | 580 | 0.6 |
| 49 | 0.60 | 0.20 | 0.40 | 0.40 | 51 | 2,100 | 550 | 1.0 |
| 50 | 0.80 | 0.20 | 0.40 | 0.40 | 49 | 1,640 | 560 | 1.3 |
| 51 | 1.00 | 0.20 | 0.40 | 0.40 | 47 | 1,360 | 560 | 2.5 |
| 52 | 0.00 | 0.20 | 0.20 | 0.60 | 32 | 320 | 440 | 2.9 |
| 53 | 0.20 | 0.20 | 0.20 | 0.60 | 20 | 3,060 | 450 | 1.6 |
| 54 | 0.40 | 0.20 | 0.20 | 0.60 | 24 | 3,880 | 340 | 0.8 |
| 55 | 0.60 | 0.20 | 0.20 | 0.60 | 25 | 4,910 | 350 | 0.9 |
| 56 | 1.00 | 0.20 | 0.20 | 0.60 | 24 | 4,800 | 340 | 1.6 |
| 57 | 0.00 | 0.30 | 0.70 | 0.00 | 24 | 120 | 430 | 1.9 |
| 58 | 0.10 | 0.30 | 0.70 | 0.00 | 9 | 760 | 330 | 1.9 |
| 59 | 0.10 | 0.30 | 0.70 | 0.00 | 8 | 680 | 310 | 1.9 |
| 60 | 0.50 | 0.30 | 0.70 | 0.00 | 7 | 580 | 340 | 4.5 |
| 61 | 0.00 | 0.30 | 0.48 | 0.22 | 42 | 170 | 1,130 | 1.9 |
| 62 | 0.10 | 0.30 | 0.48 | 0.22 | 38 | 1,830 | 960 | 1.1 |
| 63 | 0.20 | 0.30 | 0.48 | 0.22 | 30 | 2,620 | 870 | 1.1 |
| 64 | 0.50 | 0.30 | 0.48 | 0.22 | 24 | 1,450 | 660 | 2.4 |
| 65 | 1.00 | 0.30 | 0.48 | 0.22 | 26 | 1,140 | 640 | 4.5 |
| 66 | 0.00 | 0.30 | 0.36 | 0.34 | 57 | 120 | 1,040 | 3.1 |
| 67 | 0.20 | 0.30 | 0.36 | 0.34 | 50 | 2,460 | 720 | 2.4 |
| 68 | 0.40 | 0.30 | 0.36 | 0.34 | 45 | 1,970 | 670 | 1.6 |
| 69 | 0.60 | 0.30 | 0.36 | 0.34 | 42 | 1,570 | 620 | 2.4 |
| 70 | 0.80 | 0.30 | 0.36 | 0.34 | 41 | 1,230 | 610 | 3.1 |
| 71 | 1.00 | 0.30 | 0.36 | 0.34 | 40 | 1,100 | 560 | 4.3 |
| 72 | 0.00 | 0.30 | 0.20 | 0.50 | 31 | 260 | 640 | 2.4 |
| 73 | 0.10 | 0.30 | 0.20 | 0.50 | 33 | 1,810 | 520 | 1.3 |
| 74 | 0.20 | 0.30 | 0.20 | 0.50 | 29 | 4,250 | 540 | 1.3 |
| 75 | 0.50 | 0.30 | 0.20 | 0.50 | 28 | 3,400 | 500 | 1.0 |
| 76 | 1.00 | 0.30 | 0.20 | 0.50 | 23 | 2,700 | 420 | 2.7 |
| 77 | 0.00 | 0.40 | 0.60 | 0.00 | 29 | 300 | 680 | 1.8 |
| 78 | 0.10 | 0.40 | 0.60 | 0.00 | 23 | 3,120 | 560 | 1.1 |
| 79 | 0.20 | 0.40 | 0.60 | 0.00 | 13 | 5,790 | 480 | 1.1 |
| 80 | 1.00 | 0.40 | 0.60 | 0.00 | 16 | 2,320 | 350 | 1.1 |
| 81 | 0.00 | 0.40 | 0.40 | 0.20 | 52 | 110 | 2,570 | 2.1 |
| 82 | 0.10 | 0.40 | 0.40 | 0.20 | 53 | 1,650 | 2,040 | 1.1 |
| 83 | 0.20 | 0.40 | 0.40 | 0.20 | 45 | 2,190 | 1,730 | 1.1 |
| 84 | 0.50 | 0.40 | 0.40 | 0.20 | 34 | 870 | 1,290 | 3.9 |
| 85 | 1.00 | 0.40 | 0.40 | 0.20 | 32 | 400 | 1,080 | 8.2 |

TABLE I.—Continued

| No. | $u$ | $x$ | $y$ | $z$ | $kr$, percent | Q$m$ | $\epsilon$ | tan, $\delta$ percent |
|---|---|---|---|---|---|---|---|---|
| 86 | 0.00 | 0.40 | 0.31 | 0.29 | 45 | 150 | 1,300 | 3.3 |
| 87 | 0.20 | 0.40 | 0.31 | 0.29 | 43 | 2,390 | 980 | 2.5 |
| 88 | 0.40 | 0.40 | 0.31 | 0.29 | 37 | 1,500 | 770 | 1.9 |
| 89 | 0.60 | 0.40 | 0.31 | 0.29 | 34 | 1,090 | 700 | 1.3 |
| 90 | 0.80 | 0.40 | 0.31 | 0.29 | 31 | 860 | 700 | 1.6 |
| 91 | 1.00 | 0.40 | 0.31 | 0.29 | 26 | 650 | 650 | 1.8 |
| 92 | 0.00 | 0.40 | 0.20 | 0.40 | 31 | 220 | 1,050 | 4.0 |
| 93 | 0.10 | 0.40 | 0.20 | 0.40 | 33 | 2,510 | 810 | 1.1 |
| 94 | 0.20 | 0.40 | 0.20 | 0.40 | 32 | 4,400 | 830 | 1.1 |
| 95 | 0.50 | 0.40 | 0.20 | 0.40 | 27 | 2,680 | 650 | 2.3 |
| 96 | 1.00 | 0.40 | 0.20 | 0.40 | 23 | 1,500 | 500 | 4.6 |
| 97 | 0.00 | 0.50 | 0.50 | 0.00 | 34 | 200 | 1,260 | 1.6 |
| 98 | 0.10 | 0.50 | 0.50 | 0.00 | 24 | 2,120 | 890 | 1.3 |
| 99 | 0.20 | 0.50 | 0.50 | 0.00 | 23 | 1,380 | 790 | 1.3 |
| 100 | 0.50 | 0.50 | 0.50 | 0.00 | 14 | 530 | 570 | 5.5 |
| 101 | 0.00 | 0.50 | 0.35 | 0.15 | 58 | 70 | 5,370 | 2.4 |
| 102 | 0.10 | 0.50 | 0.35 | 0.15 | 52 | 2,090 | 3,000 | 1.5 |
| 103 | 0.20 | 0.50 | 0.35 | 0.15 | 44 | 1,900 | 2,150 | 1.5 |
| 104 | 1.00 | 0.50 | 0.35 | 0.15 | 13 | 1,370 | 860 | 1.1 |
| 105 | 0.00 | 0.50 | 0.25 | 0.25 | 33 | 150 | 2,180 | 3.5 |
| 106 | 0.20 | 0.50 | 0.25 | 0.25 | 36 | 1,920 | 1,340 | 3.5 |
| 107 | 0.40 | 0.50 | 0.25 | 0.25 | 29 | 1,170 | 1,100 | 3.4 |
| 108 | 0.60 | 0.50 | 0.25 | 0.25 | 26 | 870 | 940 | 5.7 |
| 109 | 0.60 | 0.50 | 0.25 | 0.25 | 23 | 610 | 870 | 9.4 |
| 110 | 0.80 | 0.50 | 0.25 | 0.25 | 18 | 400 | 810 | 14.8 |
| 111 | 0.00 | 0.50 | 0.15 | 0.35 | 25 | 180 | 2,050 | 4.1 |
| 112 | 0.10 | 0.50 | 0.15 | 0.35 | 32 | 2,640 | 1,700 | 1.2 |
| 113 | 0.20 | 0.50 | 0.15 | 0.35 | 28 | 3,100 | 1,240 | 1.2 |
| 114 | 0.50 | 0.50 | 0.15 | 0.35 | 8 | 1,780 | 890 | 4.2 |
| 115 | 0.00 | 0.60 | 0.30 | 0.10 | 34 | 50 | 6,930 | 3.5 |
| 116 | 0.10 | 0.60 | 0.30 | 0.10 | 39 | 1,750 | 3,590 | 1.9 |
| 117 | 0.20 | 0.60 | 0.30 | 0.10 | 37 | 880 | 2,720 | 1.9 |
| 118 | 0.50 | 0.60 | 0.30 | 0.10 | 21 | 360 | 1,590 | 10.3 |
| 119 | 1.00 | 0.60 | 0.30 | 0.10 | 5 | 250 | 980 | 11.2 |
| 120 | 0.10 | 0.70 | 0.30 | 0.00 | 17 | 950 | 5,120 | 1.8 |
| 121 | 0.20 | 0.70 | 0.30 | 0.00 | 23 | 960 | 3,910 | 1.8 |
| 122 | 0.50 | 0.70 | 0.30 | 0.00 | 22 | 210 | 2,430 | 2.21 |
| 123 | 0.10 | 0.70 | 0.00 | 0.30 | 9 | 350 | 1,180 | 9.9 |
| 124 | | 0.00 | 0.60 | 0.40 | ------ | ------ | 300 | 2.4 |
| 125 | | 0.00 | 0.55 | 0.45 | 8 | 30 | 350 | 1.3 |
| 126 | | 0.00 | 0.48 | 0.52 | 4.2 | 250 | 1,060 | 1.6 |
| 127 | | 0.00 | 0.40 | 0.60 | 30 | 320 | 460 | 3.1 |
| 128 | | 0.00 | 0.30 | 0.70 | 24 | 380 | 380 | 3.3 |
| 129 | | 0.00 | 0.10 | 0.90 | 10 | 580 | 280 | 3.4 |

Referring to the characteristic values of samples Nos. 124 through 129, in Table 1, which represent solid solution compositions of the known system $PbTiO_3$—$PbZrO_3$, it will be noticed that the values of $kr$ are 42 percent at most, while the values of Q$m$ become inevitably small at or in the vicinity of the compositions having comparatively large $kr$ values.

It will also be noted from the table that the values of $kr$ and of solid solution compositions of the known ternary system $(Pb(Ni_{1/3}Nb_{2/3})O_3$—$PbTiO_3$—$PbZrO_3$ (all samples in Table 1 for which $u$=0.00 corresponding to these compositions) can be controlled in an appreciably wide range, whereas the values of Q$m$ become markedly small. This is explained by reference to FIGS. 1, 2 and 3.

In contrast, solid solution compositions of the quaternary system $$Pb(Mn_{1/3}Nb_{2/3})O_3—Pb(Ni_{1/3}Nb_{2/3})O_3—PbTiO_3—PbZrO_3$$

as will be evident from the table, enable all of the values of $kr$, $\epsilon$, and tan $\delta$ to be controlled in a wide range and, at the same time, values of Q$m$ to be markedly increased, rendering them very useful as piezoelectric materials.

Figure 5:
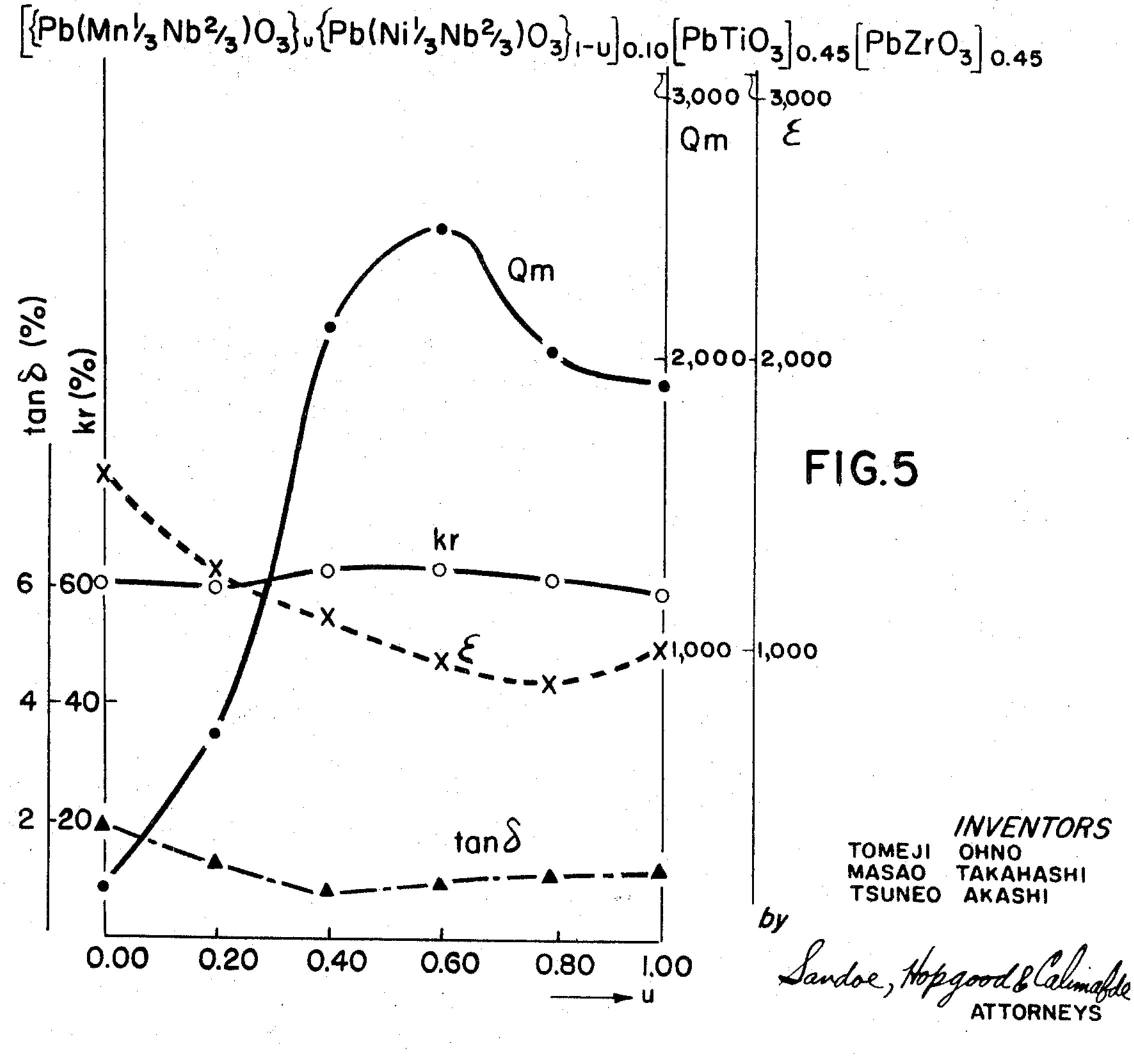

FIGS. 5 through 8 illustrate the foregoing clearly. FIG. 5 is a plot of sample Nos. 30 through 35 and illustrates the manner in which the values of $kr$, Q$m$, $\epsilon$, and tan $\delta$ vary as $Pb(Mn_{1/3}Nb_{2/3})O_3$ and $Pb(Ni_{1/3}Nb_{2/3})O_3$ are combined in varying proportions (or the value of $u$ in Table 1 is varied) with mol percent of $$Pb(Mn_{1/3}Nb_{2/3})O_3—Pb(Ni_{1/3}Nb_{2/3})O_3$$

$PbTiO_3$, and $PbZrO_3$ fixed at 10, 45 and 45, respectively.

Figure 6:
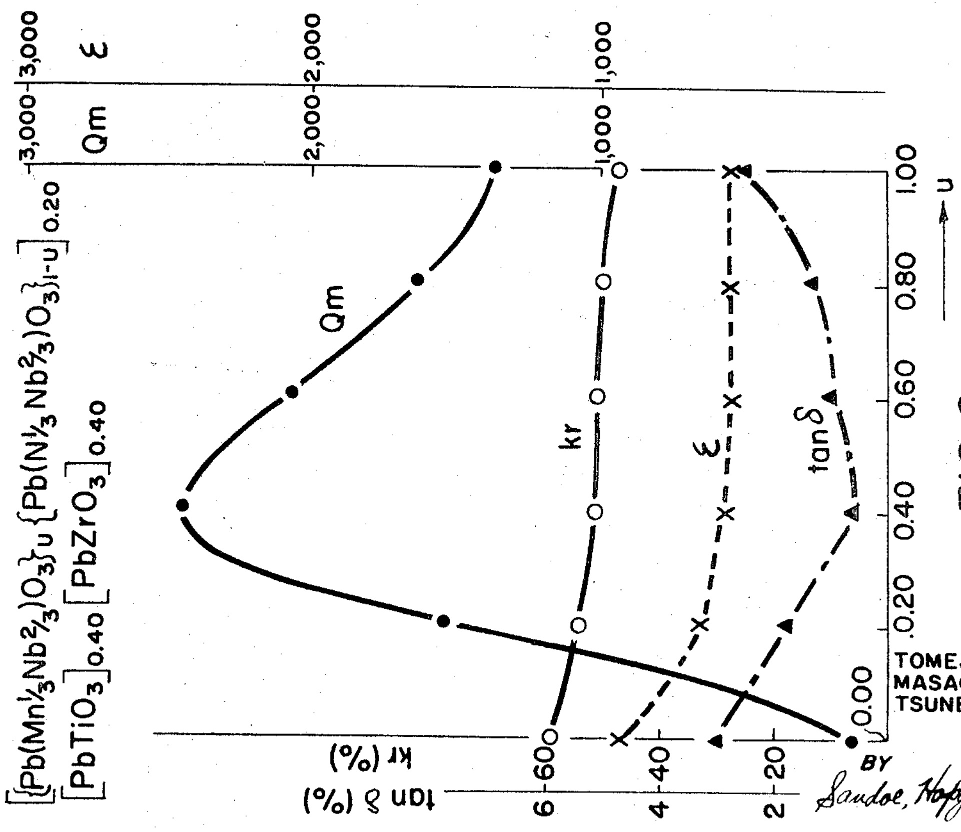

FIG. 6 is a plot of sample Nos. 46 through 51 and illustrates the manner in which these characteristics vary as the value of $u$ is varied as shown in Table 1 with mol percent of the same members fixed at 20, 40 and 40, respectively.

Figure 7:
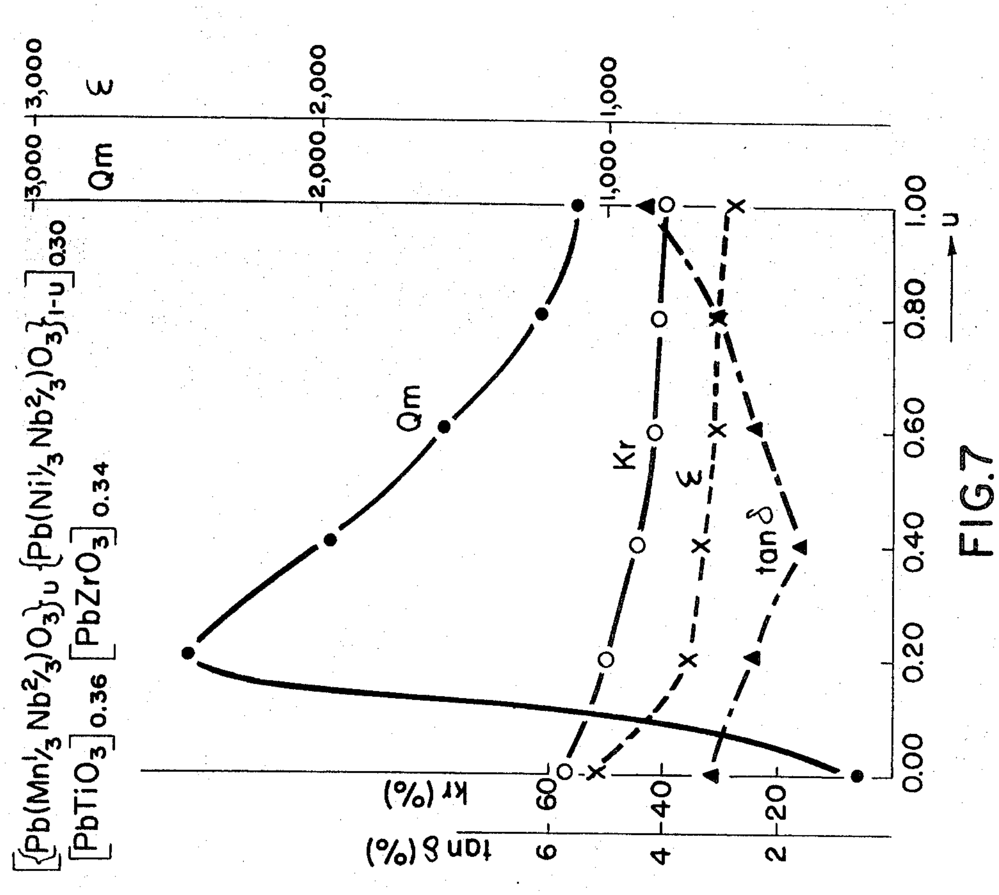

FIG. 7 is a plot of sample Nos. 66 through 71 and illustrates the manner in which these characteristics vary as the value of $u$ is varied as shown in Table 1 with mol percent of the same members fixed at 30, 36 and 34, respectively.

Figure 8:
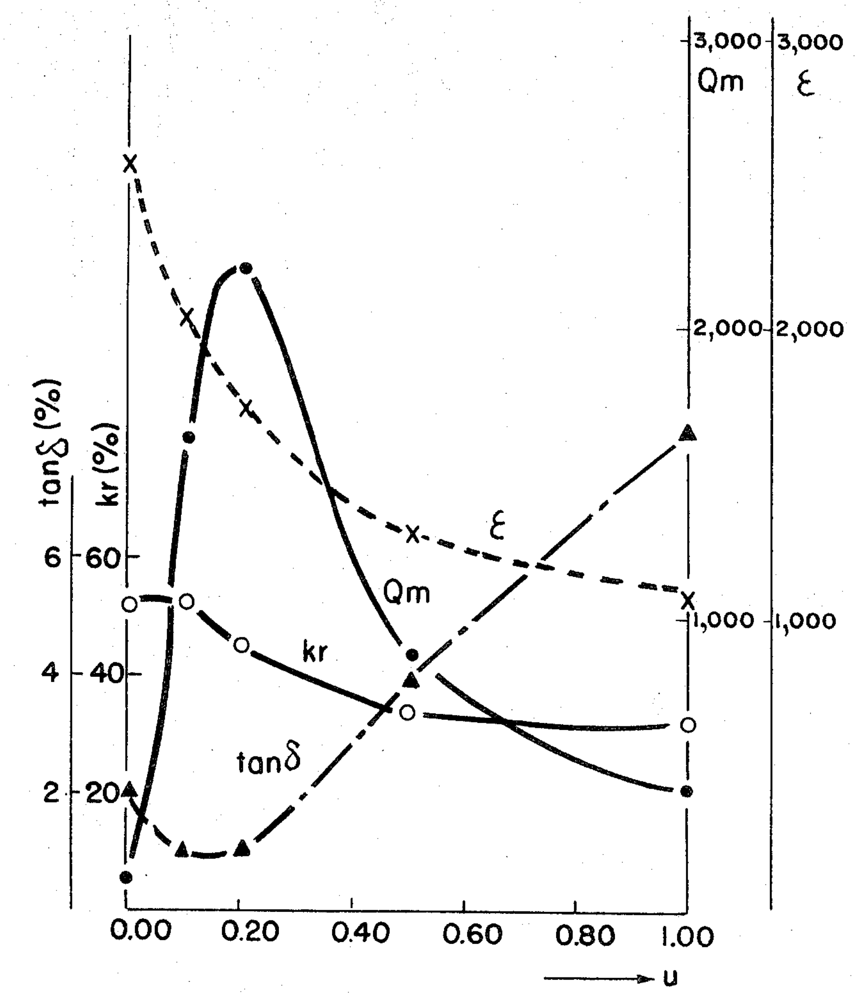

Similarly, FIG. 8 is for sample Nos. 81 through 85 and illustrates the similar effect of varying the value of $u$ as shown in Table 1 with the proportions of the same members fixed at 40, 40 and 30 mol percent, respectively.

It will be appreciated that FIGS. 5 through 8 each demonstrate excellent piezoelectric properties of solid solution compositions of the $$Pb(Mn_{1/3}Nb_{2/3})O_3-Pb(Ni_{1/3}Nb_{23/})O_3-PbTiO_3-PbZrO_3$$

system proposed by this invention. In other words, the values of $kr$, $\epsilon$, and tan $\delta$ can all be controlled in a wide range and the value of $Qm$ markedly improved.

In particular, an increase in the value of $Qm$ at some values of $u$ is really outstanding.

As illustrated in FIG. 4, the compositional range for the availability of such excellent piezoelectric properties is determined by a polygon whose apices have the following coordinates:

| x | y | z |
|---|---|---|
| 0.70 | 0.00 | 0.30 |
| 0.70 | 0.30 | 0.00 |
| 0.30 | 0.70 | 0.00 |
| 0.10 | 0.80 | 0.10 |
| 0.01 | 0.60 | 0.39 |
| 0.01 | 0.09 | 0.90 |
| 0.10 | 0.00 | 0.90 |

when the ceramic compositions according to this invention are expressed by the general empirical formula $$[\{Pb(Mn_{1/3}Nb_{2/3})O_3\}_u\{Pb(Ni_{1/3}Nb_{2/3})O_3\}_{1-u}]_x[PbTiO_3]_y[PbZrO_3]_z$$

wherein subscripts $x$, $y$ and $z$ denote mol fractions of the respective members and the value of $u$ is in the following range $0.00<u<1.00$.

Provided ceramic compositions fall within this area, they should exhibit excellent piezoelectric properties useful in practical applications.

For values of $x$ less than the least value, or 0.01, in the $x$ range, the Curie point, or transition temperature between ferroelectric and paraelectric phases, approaches room temperature. This results inevitably in the degradation in piezoelectric properties.

For values of $y$ exceeding the largest value in the $y$ range, homogeneous and high-density solid solutions become unavailable, if properly sintered, resulting in the degraded piezoelectric properties.

For values of $z$ exceeding the largest value in the $z$ range, the piezoelectric activity of ceramic compositions is too lowered to reduce them into practical applications.

While starting materials in powder form used in the example were mainly in oxidic form, salts such as oxalates, carbonates, or hydroxides, may be used, provided they easily decompose at high temperature into desired oxides as will be evidenced in the example by the employment of a carbonate ($MnCO_3$) instead of an oxide ($MnO$).

Intermediate members $Pb(Mn_{1/3}Nb_{2/3})O_3$, $$Pb(Ni_{1/3}Nb_{2/3})O_3$$

$PbTiO_3$, and $PbZrO_3$ may be separately prepared, weighed and mixed so as to obtain the required composition.

It will be evident, therefore, that the starting materials mentioned in the example is simply by way of example; any other suitable materials such as salts or intermediates in powder form may be substituted, provided they decompose at high temperature and form desired ceramic compositions.

Incidentally, as has been known by those conversant with the art, tantalum occurs as an impurity in oxidic form $Ta_2O_5$ in amounts up to several percent in commonly marketed niobium oxide $Nb_2O_5$ and similarly, hafnium occurs in oxidic form $HfO_2$ in amounts up to several percent in commonly marketed zirconium oxide $ZrO_2$. It is to be taken for granted, therefore, that the ceramic compositions contemplated by this invention may contain these elements in small amounts of such order as impurities.

Although the present invention has been described in conjunction with preferred embodiments, it is to be understood that modifications and variations may be resorted to without departing from the spirit and scope of the invention as those skilled in the art will readily understand. Such modifications and variations are considered to be within the purview and scope of the invention and the appended claim.

What is claimed is:

1. Piezoelectric ceramics consisting essentially of a solid solution of the quaternary system $$Pb(Mn_{1/3}Nb_{2/3})O_3-Pb(Ni_{1/3}Nb_{2/3})O_3-PbTiO_3-PbZrO_3$$

essentially having the compositions defined by the polygonal area of FIG. 4 bounded by the coordinates

| x | y | z |
|---|---|---|
| 0.70 | 0.00 | 0.30 |
| 0.70 | 0.30 | 0.00 |
| 0.30 | 0.70 | 0.00 |
| 0.10 | 0.80 | 0.10 |
| 0.01 | 0.60 | 0.39 |
| 0.01 | 0.09 | 0.90 |
| 0.10 | 0.00 | 0.90 |

based on the ceramic compositions expressed by the general empirical formula:

$$[\{Pb(Mn_{1/3}Nb_{2/3})O_3\}_u\{Pb(Ni_{1/3}Nb_{2/3})O_3\}_{1-u}]_x[PbTiO_3]_y[PbZrO_3]_z$$

wherein the subscripts $u$, $x$, $y$ and $z$ denote respectively mol fractions of the respective members and have the following values $$0.00<u<1.00$$

$$x+y+z=1$$

References Cited

FOREIGN PATENTS

| | | | |
|---|---|---|---|
| 814,506 | 6/1969 | Canada | 252—62.9 |
| 1,141,858 | 2/1969 | Great Britain | 252—62.9 |

TOBIAS E. LEVOW, Primary Examiner

J. COOPER, Assistant Examiner

U.S. Cl. X.R.

106—39R